(12) United States Patent
Wu et al.

(10) Patent No.: US 11,094,653 B2
(45) Date of Patent: Aug. 17, 2021

(54) BONDED ASSEMBLY CONTAINING A DIELECTRIC BONDING PATTERN DEFINITION LAYER AND METHODS OF FORMING THE SAME

(71) Applicant: SANDISK TECHNOLOGIES LLC, Addison, TX (US)

(72) Inventors: Chen Wu, Leuven (BE); Peter Rabkin, Cupertino, CA (US); Yangyin Chen, Leuven (BE); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/682,848

(22) Filed: Nov. 13, 2019

(65) Prior Publication Data

US 2021/0143115 A1 May 13, 2021

(51) Int. Cl.
*H01L 23/52* (2006.01)
*H01L 23/00* (2006.01)
(Continued)

(52) U.S. Cl.
CPC .............. *H01L 24/08* (2013.01); *H01L 24/03* (2013.01); *H01L 24/05* (2013.01); *H01L 24/80* (2013.01);
(Continued)

(58) Field of Classification Search
CPC ......... H01L 24/03; H01L 24/05; H01L 24/08; H01L 24/80; H01L 25/18; H01L 25/50
(Continued)

(56) References Cited

U.S. PATENT DOCUMENTS 5,915,167 A    6/1999  Leedy
6,166,947 A   12/2000  Asamitsu et al.
(Continued)

FOREIGN PATENT DOCUMENTS

KR    10-2019-0055770 A    5/2019

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Luan C Thai
(74) *Attorney, Agent, or Firm* — The Marbury Law Group PLLC

(57) ABSTRACT

A bonded assembly and a method of forming a bonded assembly includes providing a first semiconductor die including a first substrate, first semiconductor devices, and first bonding pads that are electrically connected to a respective node of the first semiconductor devices, providing a second semiconductor die including a second substrate, second semiconductor devices, and second bonding pads that are electrically connected to a respective node of the second semiconductor devices, forming a dielectric bonding pattern definition layer including bonding pattern definition openings therethrough over the second bonding pads, and bonding the second bonding pads to the first bonding pads, where the first metal pads expand through the bonding pattern definition openings and are bonded to a respective one of the second bonding pads.

19 Claims, 11 Drawing Sheets

(51) Int. Cl.
  *H01L 25/18* (2006.01)
  *H01L 25/00* (2006.01)
(52) U.S. Cl.
  CPC .............. *H01L 25/18* (2013.01); *H01L 25/50* (2013.01); *H01L 2224/0218* (2013.01); *H01L 2224/0219* (2013.01); *H01L 2224/03827* (2013.01); *H01L 2224/08145* (2013.01); *H01L 2224/8083* (2013.01); *H01L 2224/80905* (2013.01)
(58) Field of Classification Search
  USPC ........................................................ 257/773
  See application file for complete search history.

(56) References Cited

U.S. PATENT DOCUMENTS

| | | | |
|---|---|---|---|
| 8,697,493 B2* | 4/2014 | Sadaka | H01L 24/80 438/108 |
| 8,860,006 B2 | 10/2014 | Wang et al. | |
| 9,190,275 B2* | 11/2015 | Fujii | H01L 27/14643 |
| 9,679,867 B2* | 6/2017 | Ashidate | H01L 24/05 |
| 10,115,681 B1 | 10/2018 | Ariyoshi | |
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 2013/0020704 A1 | 1/2013 | Sadaka | |
| 2016/0086899 A1 | 3/2016 | Tong et al. | |
| 2018/0226371 A1 | 8/2018 | Enquist | |
| 2018/0233479 A1 | 8/2018 | Lin et al. | |
| 2019/0221557 A1 | 7/2019 | Kim et al. | |
| 2019/0252361 A1 | 8/2019 | Nishida | |

OTHER PUBLICATIONS

Beyne, E. et al., "Scalable, sub 2μm Pitch, Cu/SiCN to Cu/SiCN Hybrid Wafer-to-Wafer Bonding Technology," 2017 IEEE International Electron Devices Meeting (IEDM), IEDM17-729-IEDM17-732, (2017).
U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar.4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
Notification of Transmittal of the International Search Report and Written Opinion of the International Search Authority for International Patent Application No. PCT/US2020/023163, dated Aug. 10, 2020, 13 pages.

* cited by examiner

BONDED ASSEMBLY CONTAINING A DIELECTRIC BONDING PATTERN DEFINITION LAYER AND METHODS OF FORMING THE SAME

FIELD

The present disclosure relates generally to the field of semiconductor devices, and particularly to a bonded assembly containing a dielectric bonding pattern definition layer and methods for forming the same.

BACKGROUND

A three-dimensional memory array including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly is provided, which comprises: a first semiconductor die comprising a first substrate, first semiconductor devices, and first bonding pads that are electrically connected to a respective node of the first semiconductor devices; a second semiconductor die comprising a second substrate, second semiconductor devices, and second bonding pads that are electrically connected to a respective node of the second semiconductor devices; and a dielectric bonding pattern definition layer located between the first semiconductor die and the second semiconductor die and including bonding pattern definition openings therethrough, wherein each of the second bonding pads comprises a respective second bonding-side surface having a second-bonding-surface center region that is bonded to a respective one of the first bonding pads through a respective one of the bonding pattern definition openings in the bonding pattern definition layer, and having a second-bonding-surface peripheral region that laterally surrounds the second-bonding-surface center region and contacts a surface of the dielectric bonding pattern definition layer.

According to another embodiment of the present disclosure, a method of forming a bonded assembly is provided, which comprises: providing a first semiconductor die comprising a first substrate, first semiconductor devices, and first bonding pads that are electrically connected to a respective node of the first semiconductor devices; providing a second semiconductor die comprising a second substrate, second semiconductor devices, and second bonding pads that are electrically connected to a respective node of the second semiconductor devices; forming a dielectric bonding pattern definition layer including bonding pattern definition openings therethrough over the second bonding pads; and bonding the second bonding pads to the first bonding pads, wherein the first metal pads expand through the bonding pattern definition openings and are bonded to a respective one of the second bonding pads.

DETAILED DESCRIPTION

Figure 1A:
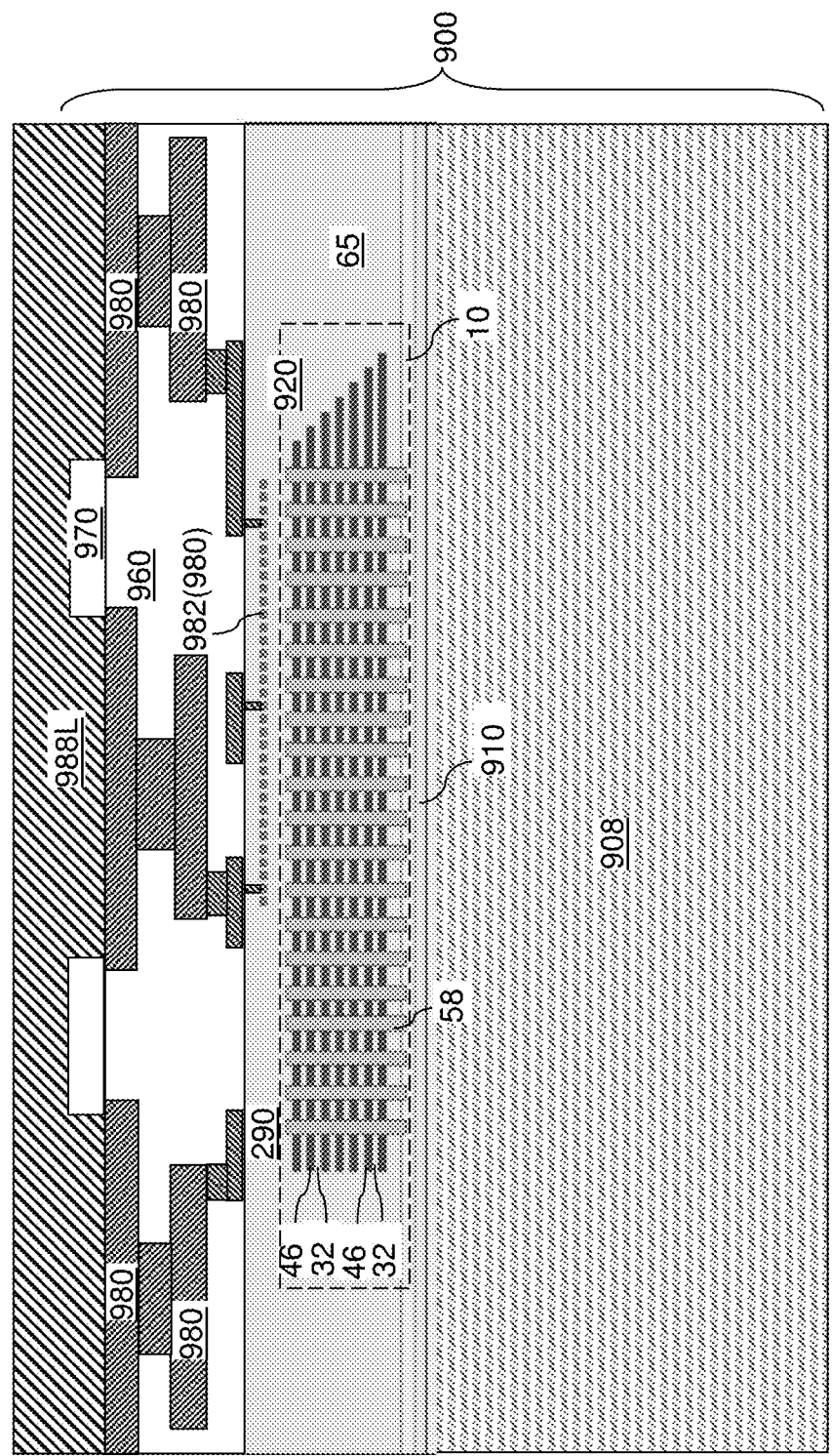
FIG. 1A is a schematic vertical cross-sectional view of a first semiconductor die during formation of a first pad-level dielectric layer and first bonding pads according to a first embodiment of the present disclosure.

A peripheral circuit can be provided for a three-dimensional memory array to control the programming, sensing, and erasing operations. The peripheral circuit on one die can be bonded to the memory array on another die using hybrid wafer-to-wafer bonding which utilizes chemical bond formation between pad dielectric material layers and between electrically conductive bonding pads of opposing dies. The present inventors determined that hybrid wafer-to-wafer bonding suffers from poor overlay tolerance, which leads to use of smaller than desired conductive bonding pads on one of the dies, such as the top die. When pad size is decreased, the expansion of the pad material (e.g., copper or copper alloy) is limited. This leads to die designs in which the pads on opposite dies have respective protrusions and recesses, which results in non-planar die bonding surfaces and complicates die planarization. Furthermore, dielectric erosion after chemical mechanical polishing (CMP) leads to yield losses. Therefore, conductive pad density to dielectric material density ratio is maintained at a lower than desired value (e.g., 1:4 of less) to avoid or reduce the yield losses.

In some embodiments of the present disclosure a dielectric bonding pattern definition layer is located between the first semiconductor die and the second semiconductor die, and includes bonding pattern definition openings therethrough. First bonding pads of a first die include a bonding-surface center region that protrudes into a respective one of the bonding pattern definition openings to be bonded to a respective second bonding pad of a second die, the various aspects of which are described herein in detail. This bonding configuration improves the overlay tolerance, reduces the limitation on bonding pad size and density, reduces erosion and simplifies the planarization process. The dielectric bonding pattern definition layer may also act as insulation between laterally adjacent bonding interfaces to prevent short circuits.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1A, a first semiconductor die 900 according to an embodiment of the present disclosure is illustrated. The first semiconductor die 900 includes a first substrate 908, first semiconductor devices 920 overlying the first substrate 908, first dielectric material layers (290, 960, 970) overlying the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960, 970) may include first contact-level dielectric layers 290 embedding contact via structures and bit lines 982, first interconnect-level dielectric layers 960 that embed a subset of the first metal interconnect structures 980 located above the first contact-level dielectric layers 290, and a first pad-level dielectric layer 970 that is formed above the first interconnect-level dielectric layer 960. The bit lines 982 are a subset of the first metal interconnect structures 980 and may electrically contact drain regions located above the semiconductor channel at the top of the memory opening fill structures 58. The contact via structures contact various nodes of the first semiconductor devices. Interconnect metal lines and interconnect metal via structures, which are subsets of the first metal interconnect structures 980) may be embedded in the first interconnect-level dielectric layers 960. The first metal interconnect structures 980 may be located within the first interconnect-level dielectric layers 960 or within the first pad-level dielectric layer 970.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. The first pad-level dielectric layer 970 may include, and/or consist essentially of, a silicon oxide material such as undoped silicate glass (e.g., silicon oxide) or a doped silicate glass. The thickness of the first pad-level dielectric layer 970 may be in a range from 100 nm to 3,000 nm, although lesser and greater thicknesses may also be employed. The first pad-level dielectric layer 970 may have a planar top surface, which may be provided, for example, by a planarization process such as a chemical mechanical polishing (CMP) process. A topmost layer of the first interconnect-level dielectric layers 960 may be a dielectric diffusion barrier layer (not expressly shown), which may be a silicon nitride layer having a thickness in a range from 10 nm to 300 nm.

Figure 1B:
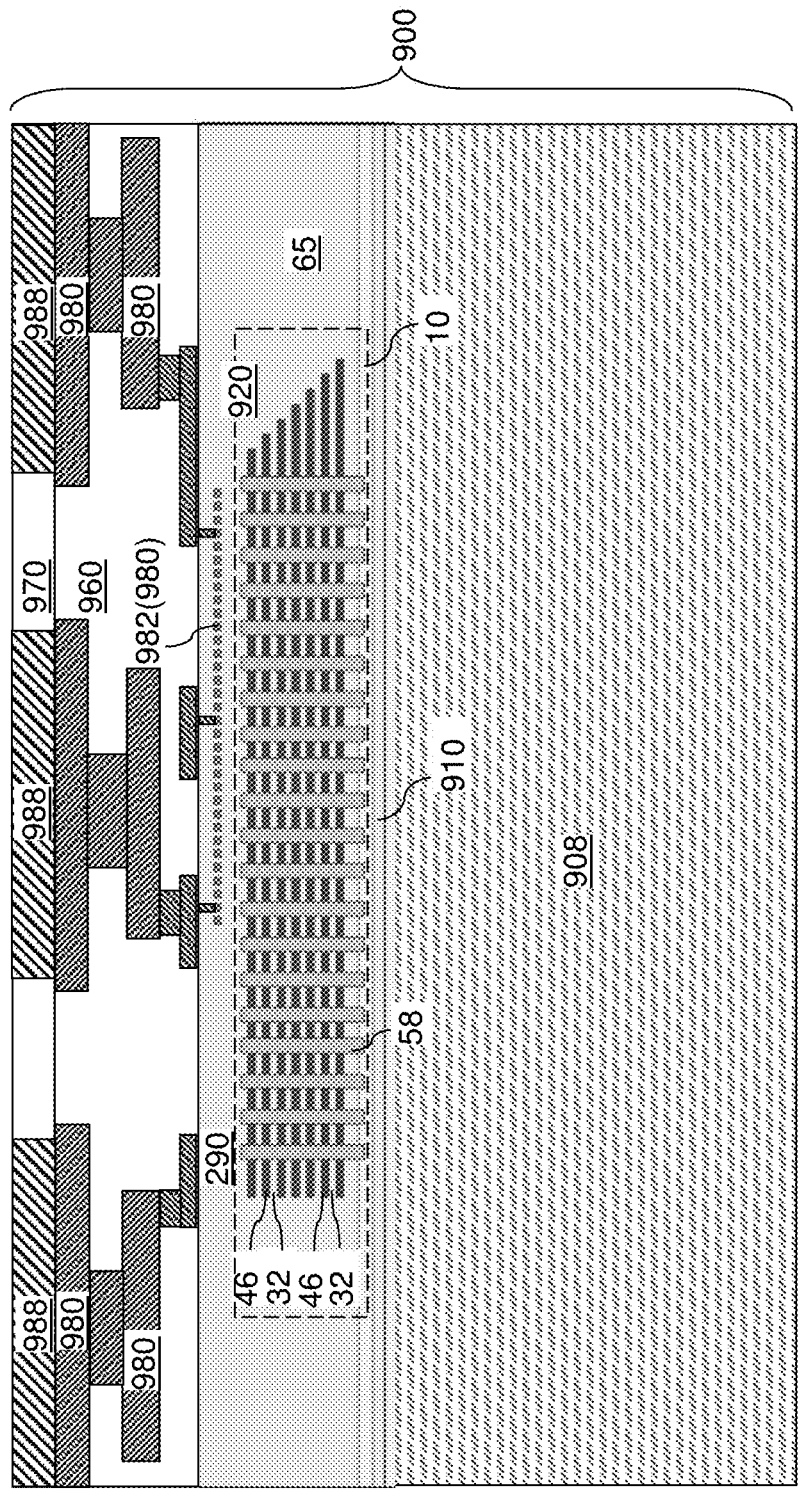
FIG. 1B is a schematic vertical cross-sectional view of a first semiconductor die after formation of a first pad-level dielectric layer and first bonding pads according to the first embodiment of the present disclosure.

A first bonding pad layer 988L is formed in the first pad-level dielectric layer 970, for example, by forming pad cavities in the first pad-level dielectric layer 970 and forming at least one conductive material in the pad cavities and over the first pad-level dielectric layer 970. As shown in FIG. 1B, the first bonding pad layer 988L is planarized by CMP even with the top of the first pad-level dielectric layer 970 to leave first bonding pads 988 in the pad cavities. Alternatively, the first bonding pads 988 are formed on the first metal interconnect structures 980 first, followed by forming the first pad-level dielectric layer 970 over and around the first bonding pads 988, followed by planarizing the first pad-level dielectric layer 970 to expose the top surface of the first bonding pads 988. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP.

Each of the first bonding pads 988 is surrounded by the first pad-level dielectric layer 970 and contacts a respective underlying one of the first metal interconnect structures 980. Each of the first bonding pads 988 is electrically connected to a respective node of the first semiconductor devices 920. The first bonding pads 988 can have a respective polygonal shape, a respective rounded polygonal shape (i.e., a shape modified from a polygon by rounding corners), or a respective curvilinear shape (a shape including lines and/or curves) having a closed periphery. The maximum lateral dimension of each first bonding pad 988 can be in a range from 5 microns to 100 microns, although lesser and greater maximum lateral dimensions can also be employed.

Figure 2:
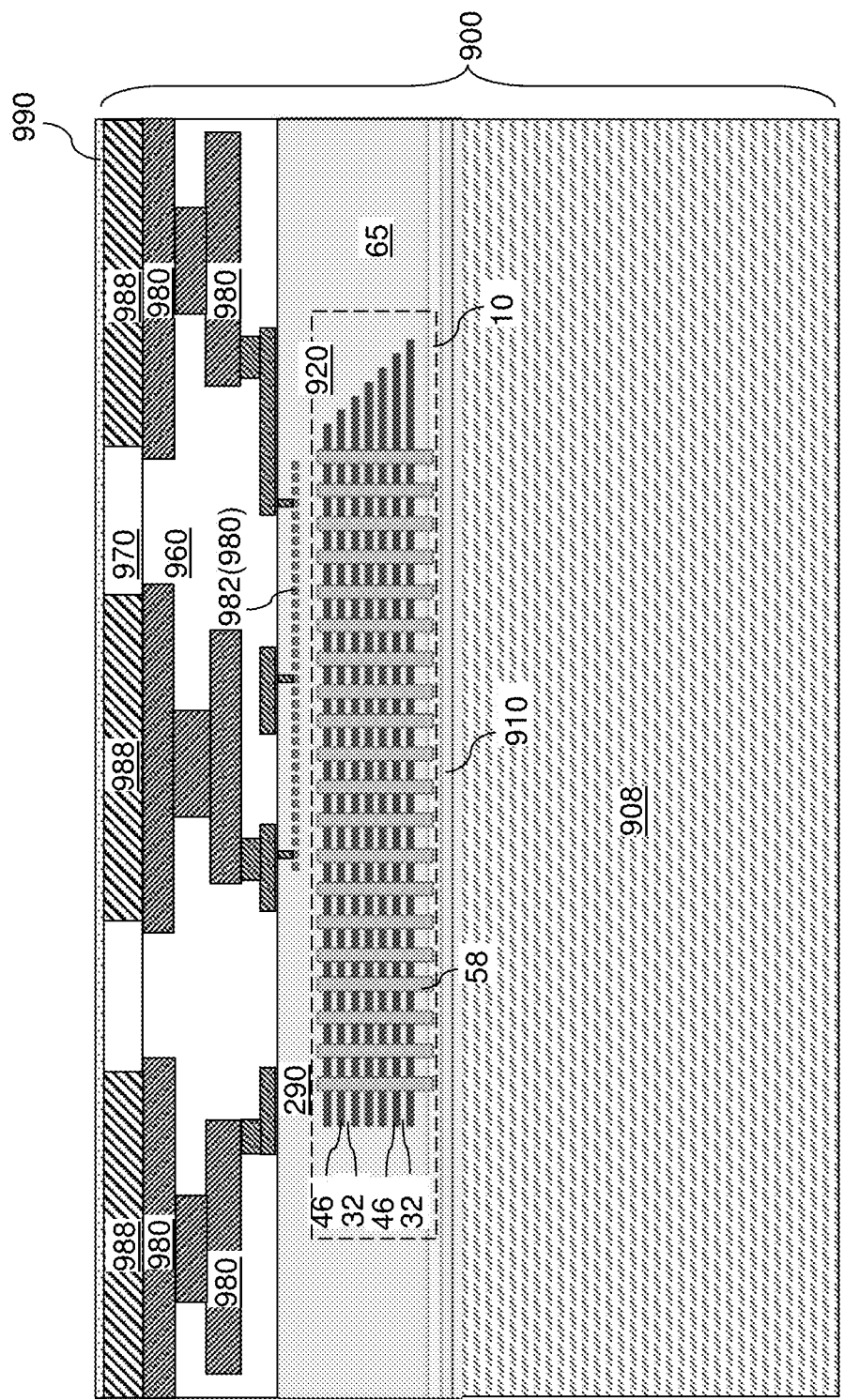
FIG. 2 is a schematic vertical cross-sectional view of the first semiconductor die after formation of a dielectric cover layer according to the first embodiment of the present disclosure.

Referring to FIG. 2, a dielectric cover layer 990 may be formed on the physically exposed surfaces (e.g., top surface) of the first bonding pads 988. The dielectric cover layer 990 comprises a material which prevents bonding of covered portions of the first bonding pads 988. The dielectric cover layer 990 can include a dielectric material such as silicon oxide, silicon carbonitride (SiCN), silicon nitride, silicon oxynitride, or a dielectric metal oxide such as aluminum oxide, hafnium oxide, zirconium oxide, or titanium oxide. In one embodiment, the dielectric cover layer 990 includes silicon oxide or silicon carbonitride (SiCN). The dielectric cover layer 990 can be formed by a chemical vapor deposition process (such as a plasma enhanced chemical vapor deposition process) or by a self-planarizing deposition process such as spin-on coating. In case a self-planarizing deposition process is employed to deposit the dielectric cover layer 990, topographical variations in the top surface of the dielectric cover layer 990 can be less than the topographical variations in the top surface of the first pad-level dielectric layer 970. In other words, the top surface of the dielectric cover layer 990 can be more planar than the top surface of the first pad-level dielectric layer 970 and improves the planarity of the die 900.

The thickness of the dielectric cover layer 990 can be selected to enable metal-to-metal bonding through openings to the formed therethrough. During a subsequent bonding step, an anneal process at an elevated temperature is employed to induce bonding of physically exposed portions of the first bonding pads 988 and second bonding pads in a second semiconductor die to be subsequently provided. Mating surfaces of the first bonding pads 988 and the second bonding pads shift vertically due to thermal expansion of the conductive materials of the first bonding pads 988 and the second bonding pads. The vertical expansion distance of the first bonding pads 988 is the vertical distance by which the mating surface of the first bonding pads shifts during an anneal step of a subsequent metal-to-metal bonding process, which can be performed at an elevated temperature in a range from 300 degrees Celsius to 400 degrees Celsius. Likewise, the vertical expansion distance of the second bonding pads is the vertical distance by which the mating surface of the second bonding pads shifts during an anneal step of a subsequent metal-to-metal bonding process. The vertical expansion distance of bonding pads (such as the first bonding pads 988 and the second bonding pads) can be in a range from 25 nm to 75 nm. The value of the vertical expansion distance for a bonding pad may depend on the thickness of the bonding pad and the elevated temperature employed during the bonding process. Typically, the total vertical expansion distance of each mating pair of bonding pads can be in a range from 50 nm to 150 nm. Thus, the thickness of the dielectric cover layer 990 can be between 10 nm and 50 nm. However, larger or smaller thickness may also be used.

In one embodiment, the dielectric cover layer 990 and a bonding pattern definition layer are provided between each the first bonding pads 988 and second bonding pads in a second semiconductor die to be subsequently provided. In this embodiment, the total thickness of the dielectric cover layer 990 and the bonding pattern definition layer is less than the sum of the vertical expansion distance of the first bonding pads 988 and the vertical expansion distance of the second bonding pads.

Generally, the thickness of the dielectric cover layer 990 can be in a range from 5 nm to 100 nm, such as 10 nm to 50 nm. In one embodiment, the thickness of the dielectric cover layer 990 can be less than the vertical expansion distance of the top surfaces (i.e., the mating surface) of the first bonding pads 988 during an anneal step of a subsequent metal-to-metal bonding process, which can be performed at an elevated temperature in a range from 300 degrees Celsius to 400 degrees Celsius. For example, the vertical expansion distance of the first bonding pads 988 along the vertical direction at the elevated temperature without mechanical constraint can be in a range from 25 nm to 75 nm, and the thickness of the dielectric cover layer 990 can be in a range from 10 nm to 50 nm, such as from 20 nm to 40 nm.

Figure 3:
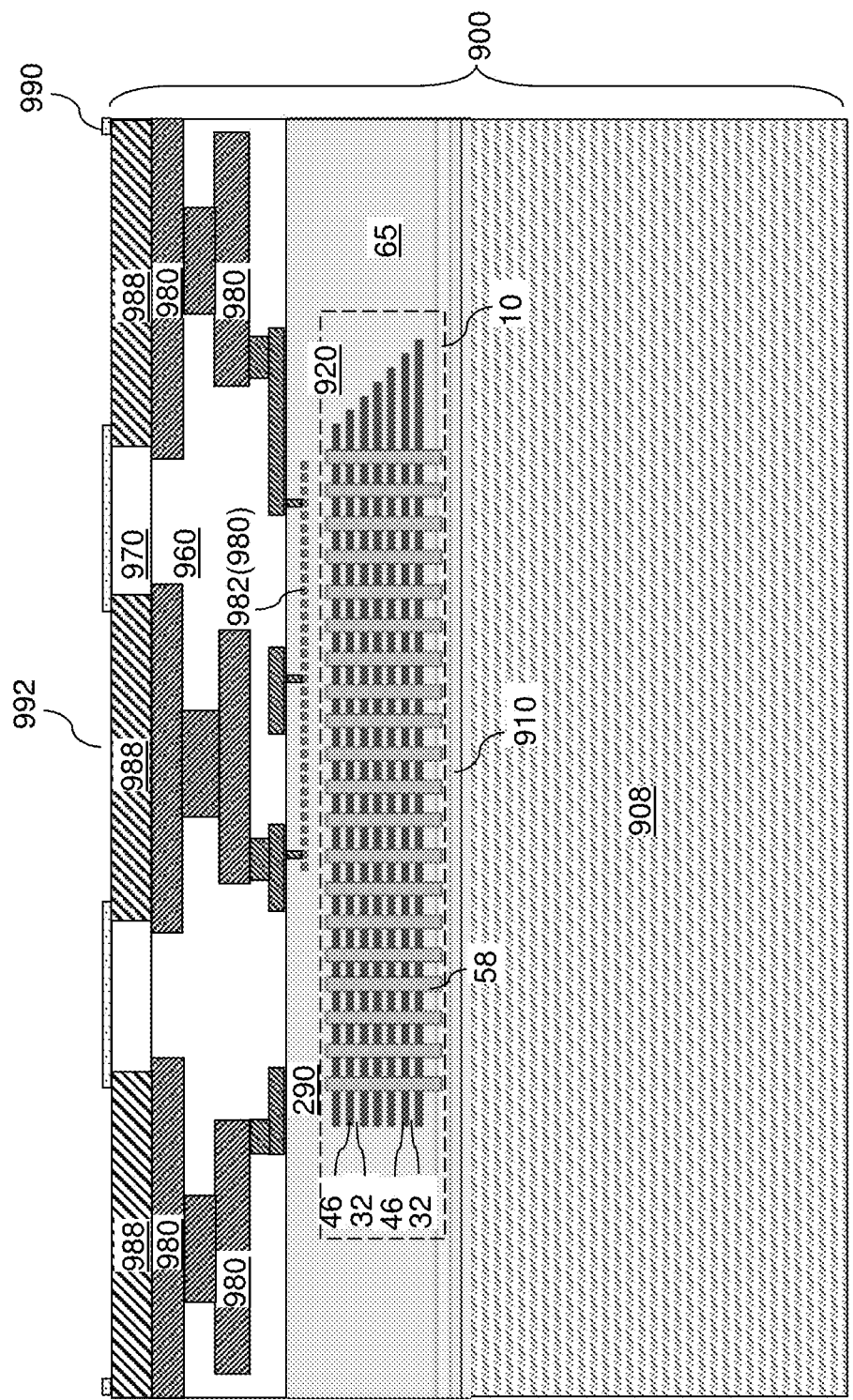
FIG. 3 is a schematic vertical cross-sectional view of the first semiconductor die after patterning cover layer openings through the dielectric cover layer according to the first embodiment of the present disclosure.

Referring to FIG. 3, a photoresist layer can be applied over the dielectric cover layer 990, and can be lithographically patterned to form openings over the first bonding pads 988. An etch process can be performed to form openings through the dielectric cover layer 990. The openings through the dielectric cover layer 990 are herein referred to as cover layer openings 992. At least a center portion of each top surface (mating surface) of the first bonding pads 988 can be physically exposed within each opening in the dielectric cover layer 990. In one embodiment, the entire top surface of the first bonding pads 988 may be exposed in the cover layer openings 992. The pattern of the openings in the dielectric cover layer 990 defines the areas of the mating surfaces of the first bonding pads 988 that are employed for bonding with second bonding pads of a second semiconductor die.

Each of the first bonding pads 988 has a respective first bonding-side surface having a first-bonding-surface center region that is not covered with the dielectric cover layer 990 and an optional first-bonding-surface peripheral region that is covered with the dielectric cover layer 990. A bonding-side surface of a bonding pad is a surface of the bonding pad that is configured to face another bonding pad during a bonding process. The first-bonding-surface center region is physically exposed within a respective one of the cover layer openings 992. The first-bonding-surface peripheral region (if present) laterally surrounds the first-bonding-surface center region.

The area of the first-bonding-surface center region of a first bonding-side surface of each first bonding pad 988 can be in a range from 50% to 100%, such as from 70% to 90%, of the total area of the first bonding-side surface. In one embodiment, each first bonding-side surface can have a polygonal shape or a rounded polygonal shape.

Figure 4:
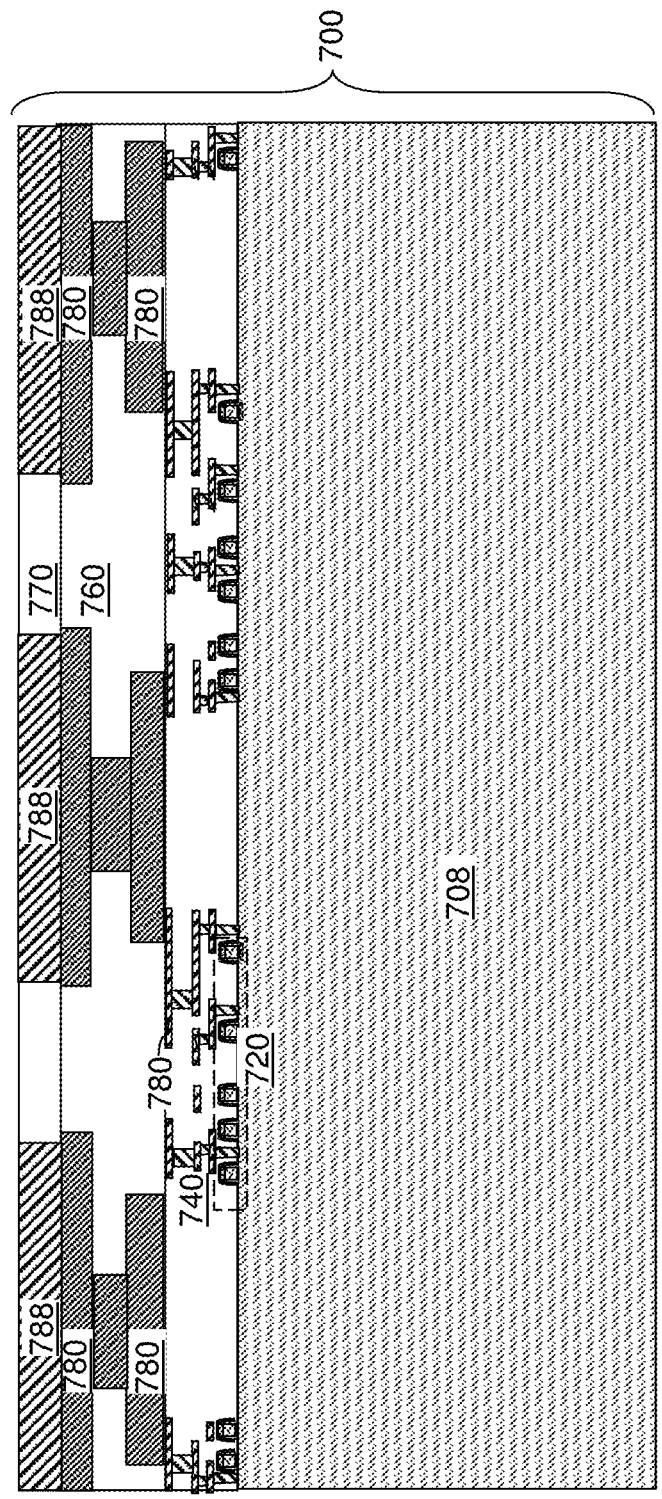
FIG. 4 is a schematic vertical cross-sectional view of a second semiconductor die after formation of a second pad-level dielectric layer and second bonding pads according to the first embodiment of the present disclosure.

Referring to FIG. 4, a second semiconductor die 700 is illustrated. The second semiconductor die 700 includes a second substrate 708, second semiconductor devices 720 overlying the second substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include at least one complementary metal oxide semiconductor (CMOS) circuitry including field effect transistors. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive lines 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers (740, 760, 770) may include proximal interconnect-level dielectric layers 740 embedding a proximal subset of the second metal interconnect structures 780 that is proximal to the second substrate 708, distal interconnect-level dielectric layers 760 embedding a distal subset of second metal interconnect structures 780 that is distal from the second substrate 708, and a second pad-level dielectric layer 770 that is formed above the distal interconnect-level dielectric layers 760. The second metal interconnect structures 780 may be located within the proximal interconnect-level dielectric layer 740, within the distal interconnect-level dielectric layers 760, or within the second pad-level dielectric layer 770.

The proximal interconnect-level dielectric layers 740 and the distal interconnect-level dielectric layers 760 may include a dielectric material such as undoped silicate glass (e.g., silicon oxide), a doped silicate glass, organosilicate glass, silicon nitride, a dielectric metal oxide, or a combination thereof. The second pad-level dielectric layer 770 may include undoped silicate glass or a doped silicate glass (e.g., a doped or undoped silicon oxide material). The thickness of the second pad-level dielectric layer 770 may be in a range from 100 nm to 3,000 nm, although lesser and greater thicknesses may also be employed. The second pad-level dielectric layer 770 may have a planar top surface, which may be provided, for example, by a planarization process such as a chemical mechanical polishing (CMP) process.

Second bonding pads 788 are formed in the second pad-level dielectric layer 770, for example, by forming pad cavities in the second pad-level dielectric layer 770 and filling the pad cavities with at least one conductive material, followed by planarization. Alternatively, the bonding pads 788 are formed on the second metal interconnect structures 780 first, followed by forming the second pad-level dielectric layer 770 over and around the second bonding pads 788, followed by planarizing the second pad-level dielectric layer 770 to expose the top surface of the second bonding pads 788. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP. The material of the second bonding pads 788 may be the same as, or may be different from, the material of the first bonding pads 988.

Each of the second bonding pads 788 is embedded in the second pad-level dielectric layer 770 and contacts a respective underlying one of the second metal interconnect structures 780. Each of the second bonding pads 788 is electrically connected to a respective node of the second semiconductor devices 720. The second bonding pads 788 can have a respective polygonal shape, a respective rounded polygonal shape (i.e., a shape modified from a polygon by rounding corners), or a respective curvilinear shape (a shape including lines and/or curves) having a closed periphery. The maximum lateral dimension of each second bonding pad 788 can be in a range from 5 microns to 100 microns, although lesser and greater maximum lateral dimensions can also be employed.

The types of devices of the first semiconductor die 900 and of the second semiconductor die 700 may be selected in any manner such that the devices 920 of the first semiconductor die 900 and the devices 720 of the second semiconductor die 700 may communicate with each other, and control, and or are controlled by, devices in the other semiconductor die. In one embodiment, one of the first semiconductor die 900 and the second semiconductor die 700 comprises a memory die including memory elements, such as a three-dimensional array of memory elements, and another of the first semiconductor die 900 and the second semiconductor die 700 comprises a logic die including peripheral circuitry configured to operate the memory elements, such as the three-dimensional array of memory elements. While the present disclosure is described employing an embodiment in which the first semiconductor die 900 is a memory die and the second semiconductor die 700 is a logic die, embodiments are expressly contemplated herein in which the first semiconductor die 900 is a logic die and the second semiconductor die 700 is a memory die.

Figure 5:
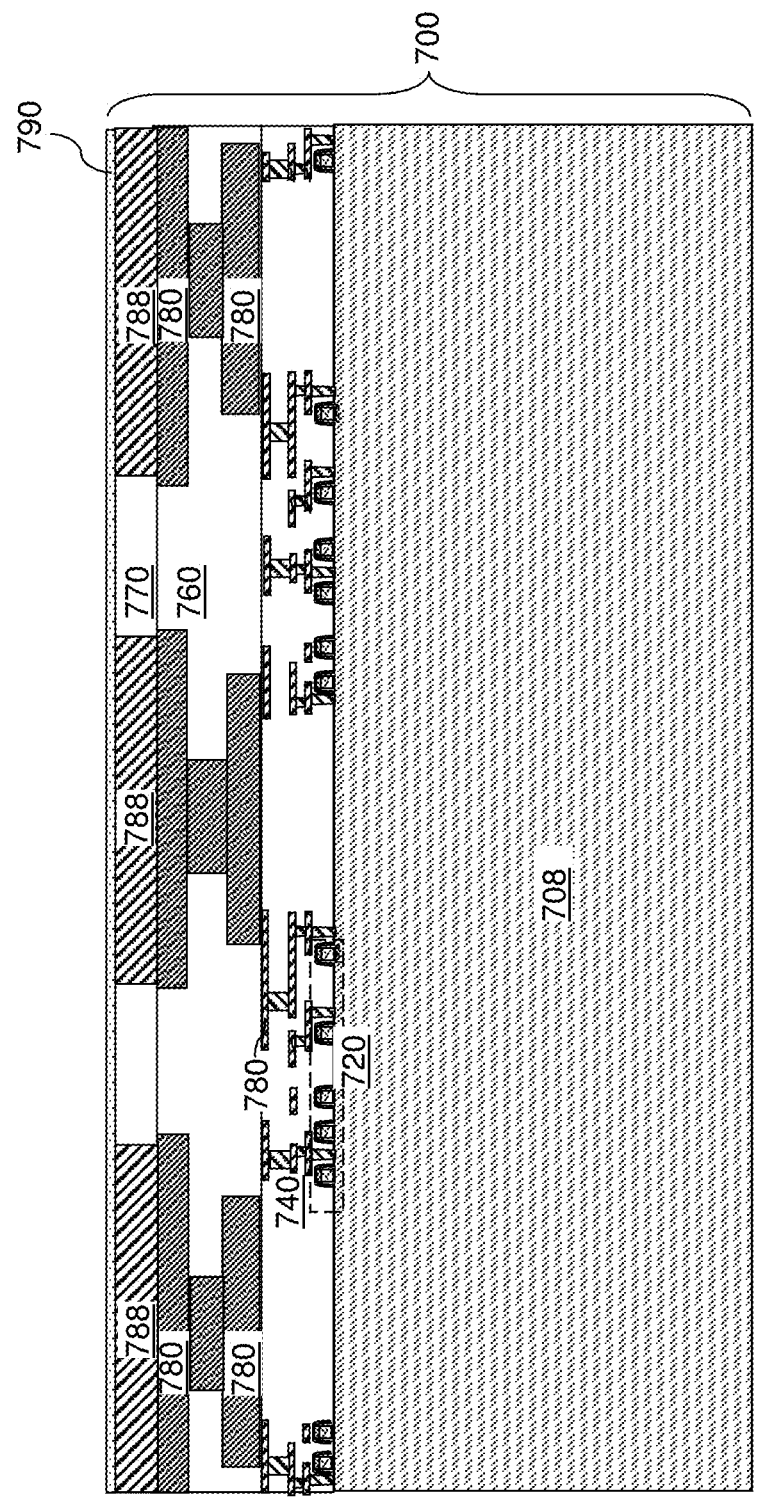
FIG. 5 is a schematic vertical cross-sectional view of the second semiconductor die after formation of a bonding pattern definition layer according to the first embodiment of the present disclosure.

Referring to FIG. 5, a bonding pattern definition layer 790 may be formed on the physically exposed surfaces (e.g., top surface) of the second bonding pads 788. The bonding pattern definition layer 790 comprises a material which prevents bonding of covered portions of the second bonding pads 788 to the first bonding pads 988. The bonding pattern definition layer 790 can include any material that can be employed for the dielectric cover layer 990. The bonding pattern definition layer 790 may include the same material as, or may include a different material from, the dielectric cover layer 990. The bonding pattern definition layer 790 can include a dielectric material such as silicon oxide, silicon carbonitride (SiCN), silicon nitride, silicon oxynitride, or a dielectric metal oxide such as aluminum oxide, hafnium oxide, zirconium oxide, or titanium oxide. In one embodiment, the bonding pattern definition layer 790 includes silicon oxide or silicon carbonitride (SiCN). The bonding pattern definition layer 790 can be formed by a chemical vapor deposition process (such as a plasma enhanced chemical vapor deposition process) or by a self-planarizing deposition process such as spin-on coating. In case a self-planarizing deposition process is employed to deposit the bonding pattern definition layer 790, topographical variations in the top surface of the bonding pattern definition layer 790 can be less than the topographical variations in the top surface of the second pad-level dielectric layer 770.

The thickness of the bonding pattern definition layer 790 can be selected to enable metal-to-metal bonding through openings to the formed therethrough. In one embodiment, the total thickness of the dielectric cover layer 990 and the bonding pattern definition layer 790 is less than the sum of the vertical expansion distance of the first bonding pads 988 and the vertical expansion distance of the second bonding pads 788. In one embodiment, the thickness of the bonding pattern definition layer 790 can be less than the vertical expansion distance of the top surfaces (i.e., the mating surface) of the second bonding pads 788 during an anneal step of a subsequent metal-to-metal bonding process, which can be performed at an elevated temperature in a range from 300 degrees Celsius to 400 degrees Celsius. For example, the vertical expansion distance of the second bonding pads 788 along the vertical direction at the elevated temperature without mechanical constraint can be in a range from 25 nm to 75 nm, and the thickness of the bonding pattern definition layer 790 can be in a range from 10 nm to 50 nm, such as from 20 nm to 40 nm.

Figure 6:
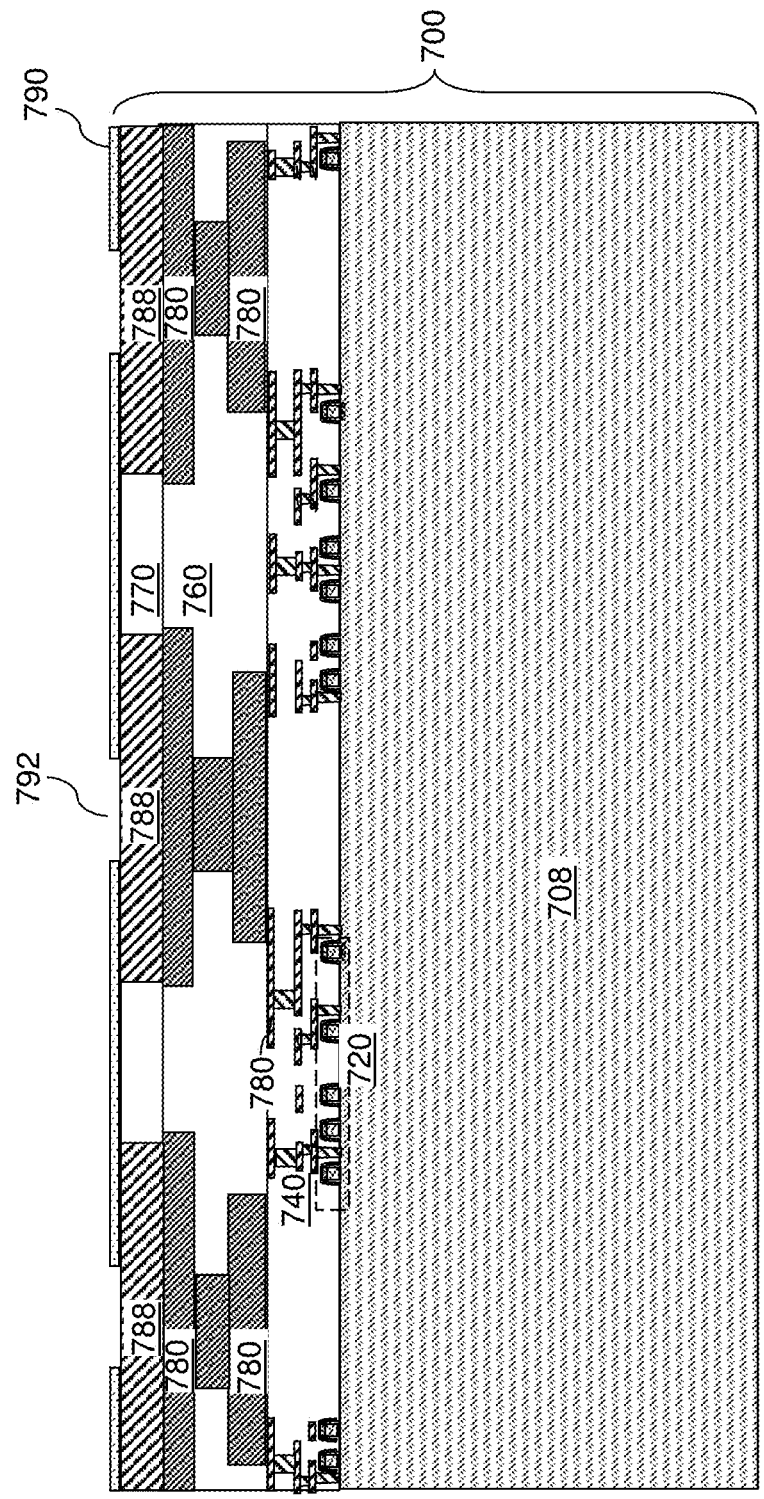
FIG. 6 is a schematic vertical cross-sectional view of the second semiconductor die after patterning bonding pattern definition openings through the bonding pattern definition layer according to the first embodiment of the present disclosure.

Referring to FIG. 6, a photoresist layer can be applied over the bonding pattern definition layer 790, and can be lithographically patterned to form openings over the second bonding pads 788. An etch process can be performed to form openings 792 through the bonding pattern definition layer 790. The openings 792 through the bonding pattern definition layer 790 are herein referred to as bonding pattern definition openings. The center portion of each top surface (mating surface) of the second bonding pads 788 can be physically exposed within each opening 792 in the bonding pattern definition layer 790.

If during bonding the second semiconductor die 700 will be located over the first semiconductor die 900, then in one embodiment, the pattern of the cover layer openings 992 in the dielectric cover layer 990 can include areas of the mirror image of the pattern of the bonding pattern definition openings 792 in the bonding pattern definition layer 790 and additional areas that surround the mirror image of the pattern of the bonding pattern definition openings 792 in the bonding pattern definition layer 790. In other words, each pattern definition opening 792 overlying a second bonding pad 788 can have a smaller area than the area of a respective cover layer opening 992 over a first bonding pad 988 to be subsequently bonded to the second bonding pad 788. The bonding pattern definition openings 792 in the bonding pattern definition layer 790 define the areas of the bonding interfaces, i.e., bonding surfaces in which metal-to-metal contact is present, between the first bonding pads 988 and the second bonding pads 788. The bonding pattern definition openings 792 through the bonding pattern definition layer 790 can have shapes such that each bonding pattern definition opening 792 can be laterally offset inward from a respective one of the cover layer opening 992 upon subsequently bonding the first bonding pads 988 to the second bonding pads 788.

Alternatively, if during bonding the second semiconductor die 700 will be located under the first semiconductor die 900, then in one embodiment, each opening 792 overlying a second bonding pad 788 can have a larger area than the area of a respective opening 992 over a first bonding pad 988 to be subsequently bonded to the second bonding pad 788. In other words, the bottom die openings are larger than the corresponding top die openings in one embodiment.

Each of the second bonding pads 788 has a respective second bonding-side surface having a second-bonding-surface center region that is not covered with the bonding pattern definition layer 790 and a second-bonding-surface peripheral region that is covered with the bonding pattern definition layer 790. The second-bonding-surface center region is physically exposed within a respective one of the openings 792. The second-bonding-surface peripheral region laterally surrounds the second-bonding-surface center region.

The area of the second-bonding-surface center region of a second bonding-side surface of each second bonding pad 788 can be in a range from 20% to 80%, such as from 40% to 60%, of the total area of the second bonding-side surface. In one embodiment, each second bonding-side surface can have a polygonal shape or a rounded polygonal shape, and can have a respective second-bonding-surface center region having a periphery that is laterally offset inward from the periphery of the polygonal shape or the rounded polygonal shape by a uniform lateral offset distance.

Figure 7:
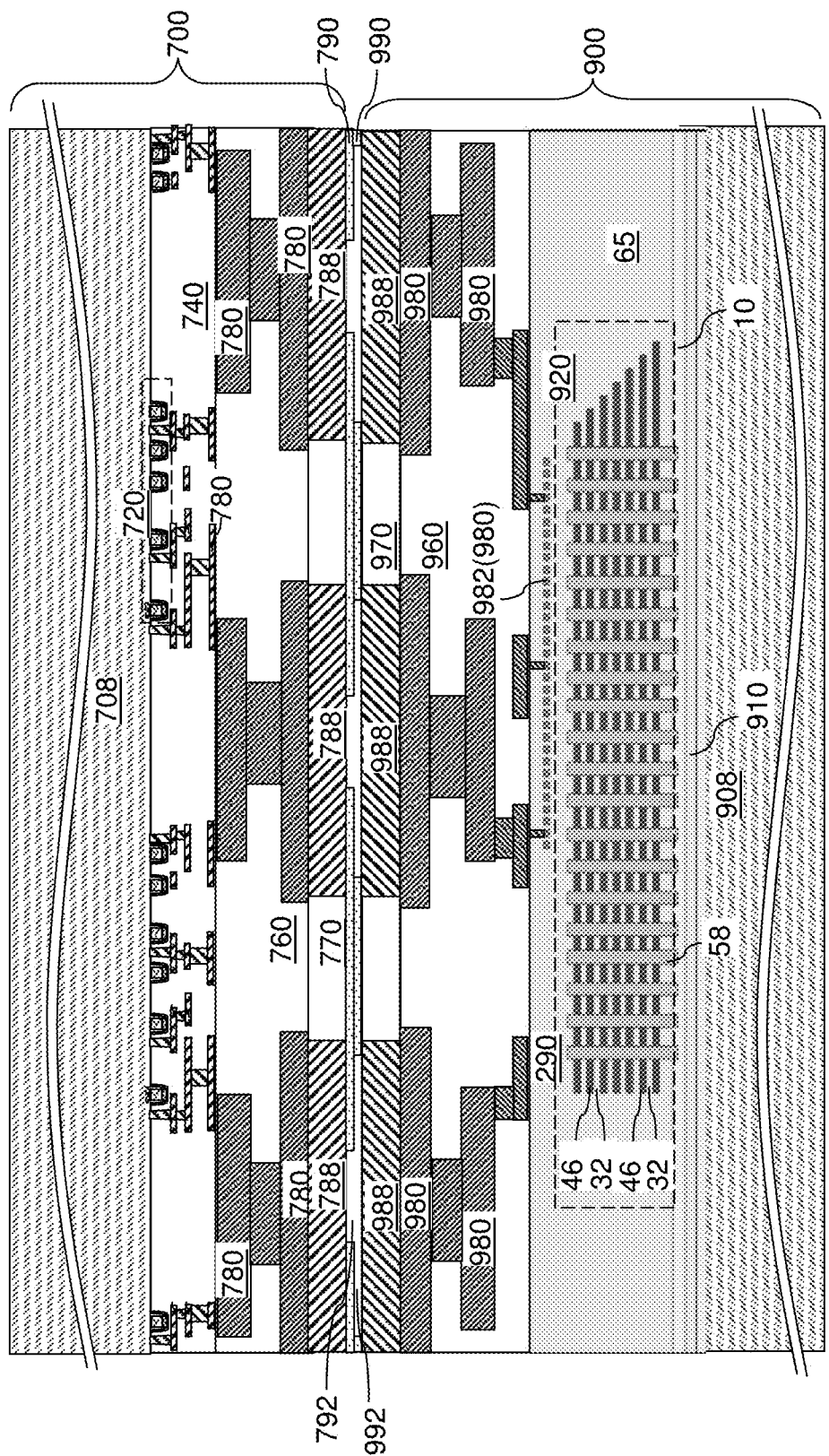
FIG. 7 is a schematic vertical cross-sectional view of an exemplary structure including the first semiconductor die and the second semiconductor die after disposing the second bonding pads over the first bonding pads according to the first embodiment of the present disclosure.

Referring to FIG. 7, the first semiconductor die 900 and the second semiconductor die 700 are oriented such that the first pad-level dielectric layer 970 faces the second pad-level dielectric layer 770. The dielectric cover layer 990 faces the bonding pattern definition layer 790. The second semiconductor die 700 and the first semiconductor die 900 are brought into contact such that the dielectric cover layer 990 contacts the bonding pattern definition layer 790.

The first semiconductor die 900 and the second semiconductor die 700 may be laterally aligned such that each second bonding pad 788 faces a respective one of the first bonding pads 988. Further, each bonding pattern definition opening 792 disposed over (or under) a respective second bonding pad 788 is located inside a periphery of a respective cover layer opening 992 disposed under (or over) a respective first bonding pad 988 with a respective lateral offset inward. Generally, the pattern of the bonding pattern definition openings 792 through the bonding pattern definition layer 790 as viewed along a vertical direction toward the second pad-level dielectric layer 770 can be derived from the mirror image of the pattern of the cover layer openings 992 through the dielectric cover layer 990 as viewed along a vertical direction toward the first pad-level dielectric layer 970 by reducing the size of the bonding pattern definition openings 792.

In one embodiment, each cover layer opening 992 through the dielectric cover layer 990 has an area that includes the entire area of a respective one of the bonding pattern definition openings 792. The periphery of each cover layer opening 992 can be laterally offset outward from the periphery of the overlapping one of the bonding pattern definition openings 792.

Figure 8:
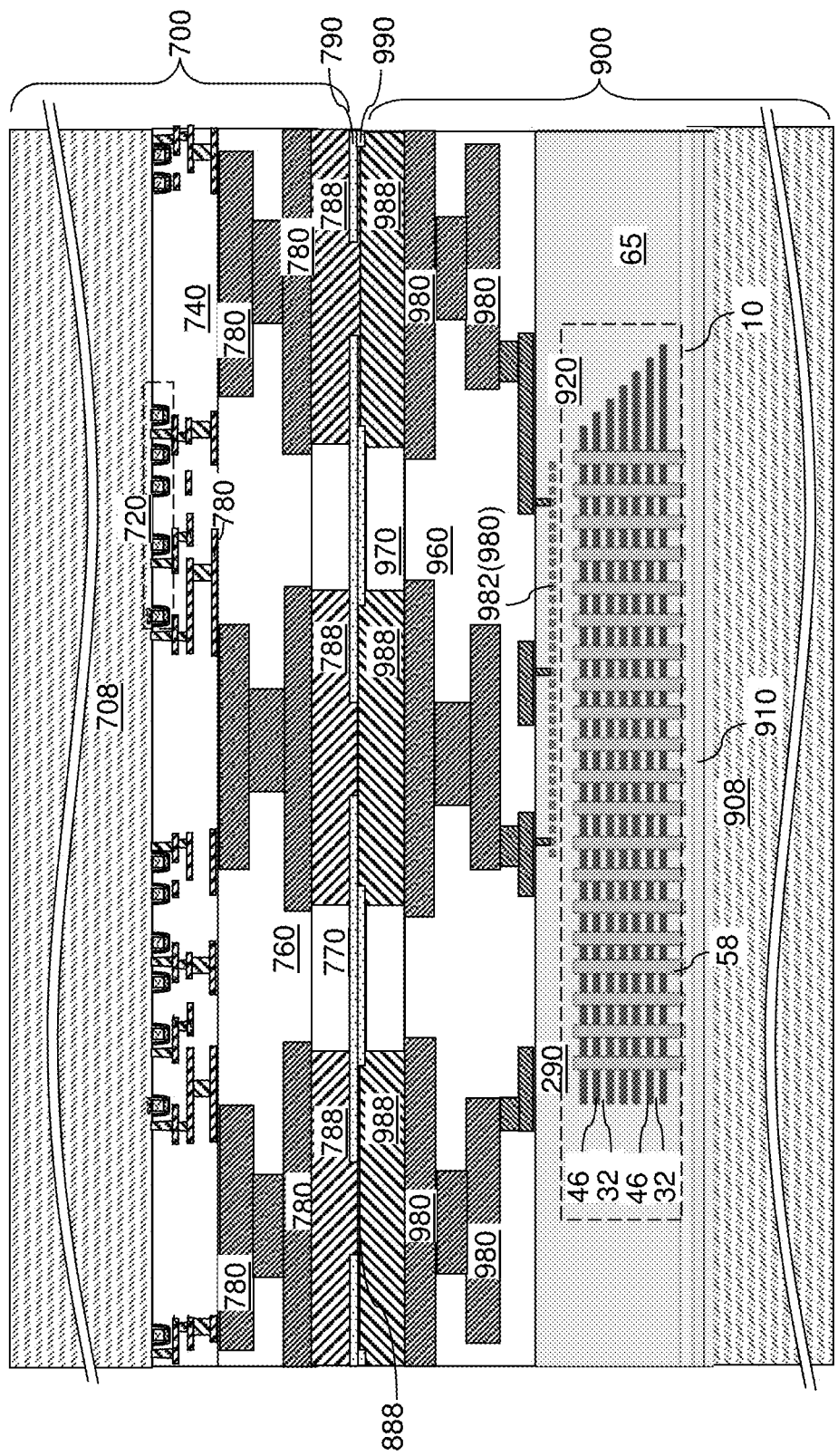
FIG. 8 is a schematic vertical cross-sectional view of the exemplary structure after bonding the second bonding pads to the first bonding pads according to the first embodiment of the present disclosure.

Referring to FIG. 8, an optional dielectric-to-dielectric bonding is performed by initially annealing the assembly of the first and second semiconductor dies at a temperature sufficient to bond the dielectric cover layer 990 to the bonding pattern definition layer 790. The annealing temperature may be between 200 and 300 degrees Celsius. Subsequently, each facing pair of the second bonding pad 788 and the first bonding pad 988 can be bonded by performing an anneal process that induces metal-to-metal bonding. The bonding pattern definition openings 792 through the bonding pattern definition layer 790 define the areas of each bonding interface 888 between a respective pair of a first bonding pad 988 and a second bonding pad 788. In one embodiment, the dielectric cover layer 990 and the dielectric bonding pattern definition layer 790 are present between each mating pair of a first bonding pad 988 and a second bonding pad 788. In the embodiment that will be described below with respect to FIGS. 9 and 10 below, the dielectric cover layer 990 is omitted, and only the bonding pattern definition layer 790 is present between each mating pair of a first bonding pad 988 and a second bonding pad 788.

The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 300 degrees Celsius to 400 degrees Celsius. The area of each bonding interface 888 between the first bonding pads 988 and the second bonding pads 788 can be the same as the area of a respective bonding pattern definition opening 792. Thus, each periphery of a bonding interface 888 can coincide with a periphery of a respective bonding pattern definition opening 792.

The sum of the vertical expansion distance by which a first-bonding-surface center region of a first bonding-side surface of a first bonding pad 988 vertically shifts and the vertical expansion distance by which the second-bonding-surface center portion of a second bonding-side surface of a second bonding pad 788 vertically shifts can be the same as the vertical separation distance between a proximal surface of the first pad-level dielectric layer 970 and the second pad-level dielectric layer 770. If the dielectric cover layer 990 is present, then the vertical separation distance between a proximal surface of the first pad-level dielectric layer 970 and the second pad-level dielectric layer 770 can be the same as the sum of the thickness of the dielectric cover layer 990 and the thickness of the bonding pattern definition layer 790. If the dielectric cover layer 990 is not present, then the vertical separation distance between a proximal surface of the first pad-level dielectric layer 970 and the second pad-level dielectric layer 770 can be the same as the thickness of the bonding pattern definition layer 790.

In case the dielectric cover layer 990 and the bonding pattern definition layer 790 include dielectric materials that can be bonded to each other, bonding between the dielectric cover layer 990 and the bonding pattern definition layer 790 may occur in the initial anneal process, which can be performed prior to providing metal-to-metal bonding between the first bonding pads 988 and the second bonding pads 788. Alternatively, if the dielectric cover layer 990 is omitted and the bonding pattern definition layer 790 and first pad-level dielectric layer 970 include dielectric materials that can be bonded to each other, bonding between the bonding pattern definition layer 790 and the second pad-level dielectric layer 770 may occur in the initial anneal process, which can be performed prior to providing metal-to-metal bonding between the first bonding pads 988 and the second bonding pads 788.

Generally, the first metal pads 988 may expand through bonding pattern definition openings 992 and contact, and are bonded to, a respective one of the second bonding pads 788. The second metal pads 788 may also expand through bonding pattern definition openings 992. In one embodiment, the bonding pattern definition layer 790 is disposed between the dielectric cover layer 990 and the second semiconductor die 700 during and after bonding the second bonding pads 788 to the first bonding pads 988. Each of the bonding pattern definition openings 792 can be located entirely within an area of a respective one of the cover layer openings 992. Each of the bonding pattern definition openings 792 can have a respective periphery that is laterally offset inward from a periphery of the respective one of the cover layer openings 992.

In one embodiment, the dielectric cover layer 990 comprises, and/or consists essentially of, a first dielectric material selected from silicon oxide, silicon carbonitride, silicon nitride, silicon oxynitride, and a dielectric metal oxide, and has a thickness in a range from 10 nm to 50 nm, and the bonding pattern definition layer 790 comprises, and/or consists essentially of, a second dielectric material selected from silicon oxide, silicon carbonitride, silicon nitride, silicon oxynitride, and a dielectric metal oxide, and has a thickness in a range from 10 nm to 50 nm.

In one embodiment, each bonded pair of the first bonding pad 988 and the second bonding pad 788 has a respective bonding interface 888 having a periphery that coincides with a respective one of the bonding pattern definition openings 792. In one embodiment, each of the first bonding pads 988 comprises a respective first bonding-side surface having a first-bonding-surface center region that protrudes into a respective one of the bonding pattern definition openings 792 through the bonding pattern definition layer 790. Each first-bonding-surface center region is bonded to a respective one of the second bonding pads 788. Each first bonding-side surface can have an optional respective first-bonding-surface peripheral region that laterally surrounds the respective first-bonding-surface center region and contacts a surface of the dielectric cover layer 990.

In one embodiment, each contact area between a bonded pair of the first bonding pad 988 and the second bonding pad 788 coincides with an area of a respective one of the bonding pattern definition openings 792. In one embodiment, the bonding pattern definition layer 790 contacts each of the second bonding pads 788 after the second bonding pads 788 are bonded to the first bonding pads 988. In one embodiment, each bonded pair of the first bonding pad 988 and the second bonding pad 788 can be bonded to each other by metal-to-metal bonding induced by metal diffusion across a respective bonding interface 888.

In one embodiment, each bonding interface 888 between the first-bonding-surface center regions of the first bonding pads 988 and the second bonding pads 788 is vertically offset from a horizontal plane including horizontal surfaces of the first-bonding-surface peripheral regions of the first bonding pads 988 by a vertical offset distance that is at least one half of a thickness of the dielectric cover layer 990. In one embodiment, the vertical offset distance can be in a range from 50% to 100% of the vertical separation distance between the first pad-level dielectric layer 970 and the second pad-level dielectric layer 770.

In one embodiment, each of the second bonding pads 788 comprises a respective second bonding-side surface having a second-bonding-surface center region that is bonded to a respective one of the first bonding pads 988 at a bonding interface 888, and having a second-bonding-surface peripheral region that laterally surrounds the first-bonding-surface center region. In one embodiment, the second pad-level dielectric layer 770 can be vertically spaced from the first pad-level dielectric layer 970 at least by the bonding pattern definition layer 790.

In one embodiment, the bonding pattern definition layer 790 can be located between, and can contact, the dielectric cover layer 990 and the second semiconductor die 700. The bonding pattern definition layer 790 includes bonding pattern definition openings 792 therethrough. Each of the bonding pattern definition openings 792 can be located entirely within an area of a respective one of the cover layer openings 992, and can have a respective periphery that is laterally offset inward from a periphery of the respective one of the cover layer openings. In one embodiment, each of the first-bonding-surface peripheral regions can contact the bonding pattern definition layer 790 at an outer periphery thereof, and can contact a respective portion of the dielectric cover layer 990 at an inner periphery thereof.

Figure 9:
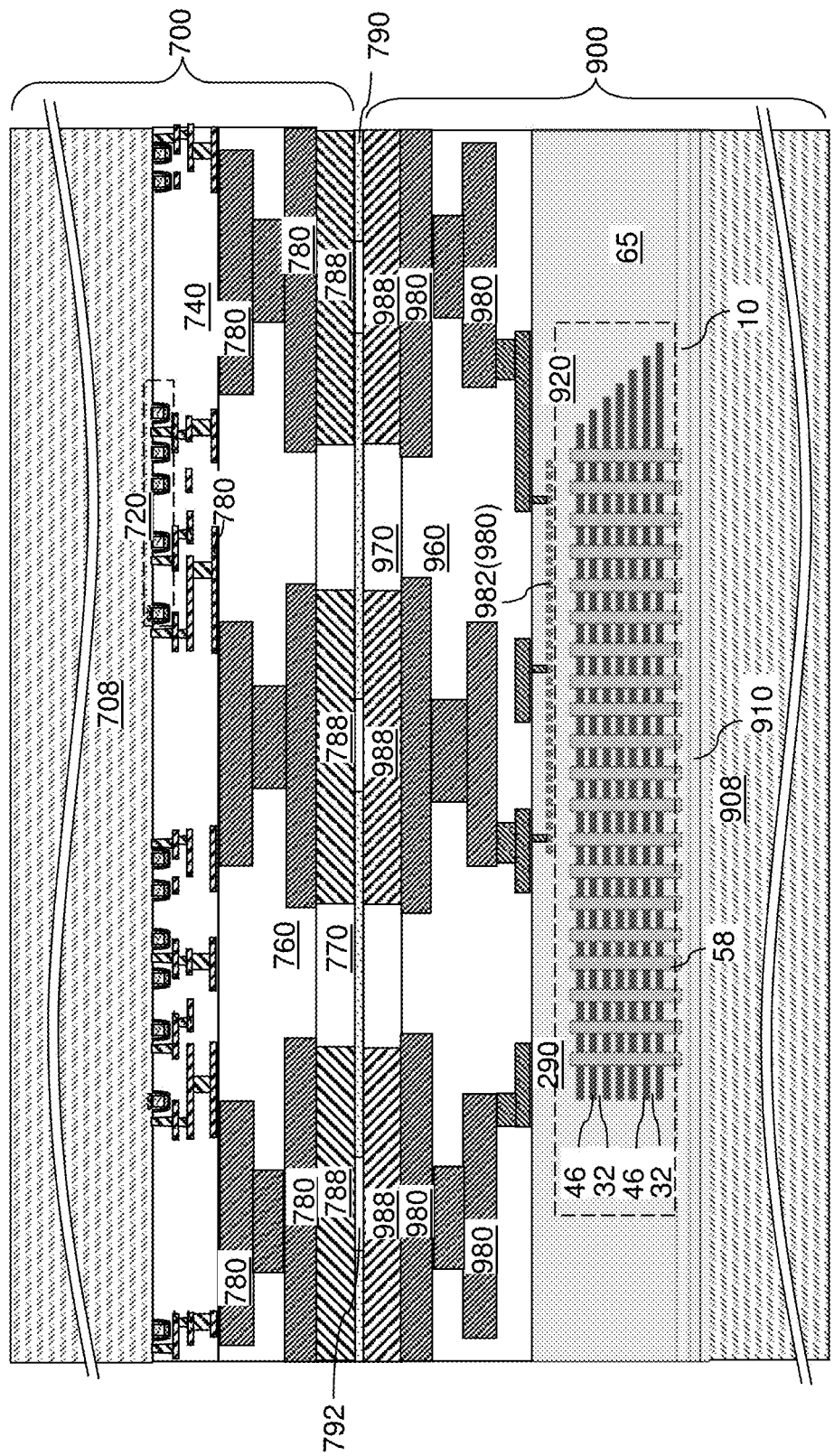
FIG. 9 is a schematic vertical cross-sectional view of a second exemplary structure including the first semiconductor die and the second semiconductor die after disposing the second bonding pads over the first bonding pads according to a second embodiment of the present disclosure.

Referring to FIG. 9, a second exemplary structure according to a second embodiment of the present disclosure is illustrated. An assembly of the first semiconductor die 900 and the second semiconductor die 700 is illustrated at the processing steps of FIG. 7, i.e., after the second bonding pads 788 are disposed over the first bonding pads 988. The second semiconductor die 700 in the second exemplary structure can be the same as the second semiconductor die 700 at the processing steps of FIG. 4. However, the dielectric cover layer 990 in the first semiconductor die 900 is omitted. Thus, the dielectric pattern definition layer 790 can directly contact a proximal horizontal surface of the first pad-level dielectric layer 970. Thus, in the second embodiment, only the dielectric bonding pattern definition layer 790 is provided between each the first bonding pads 988 and second bonding pads 788 in a second semiconductor die 700. In this second embodiment, the thickness of the dielectric bonding pattern definition layer 790 is less than the sum of the vertical expansion distance of the first bonding pads 988 and the vertical expansion distance of the second bonding pads 788.

Figure 10:
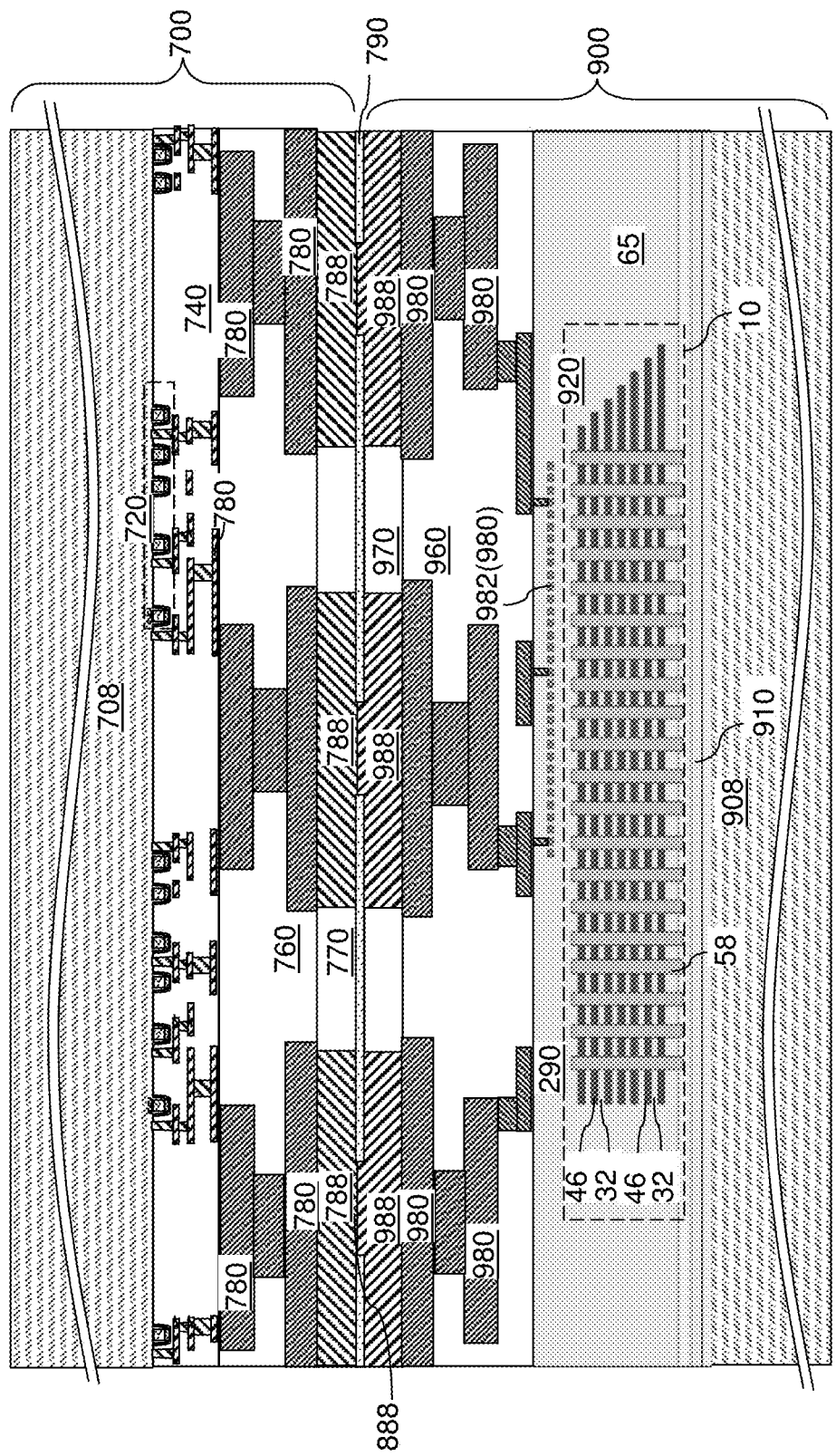
FIG. 10 is a schematic vertical cross-sectional view of the second exemplary structure after bonding the second bonding pads to the first bonding pads according to the second embodiment of the present disclosure.

Referring to FIG. 10, the processing steps of FIG. 8 can be performed to induce metal-to-metal bonding between each mating pair of the first bonding pads 988 and the second bonding pads 788. In one embodiment, each of the second bonding pads 788 comprises, and/or consists essentially of, a second bonding-side surface that faces the first semiconductor die 900, and the entirety of each of the second bonding-side surfaces contacts the bonding pattern definition layer 790 or a respective one of the first bonding pads 988. In one embodiment, the entirety of the second-bonding-surface peripheral regions contacts the bonding pattern definition layer 790. In one embodiment, the second-bonding-surface peripheral regions are vertically spaced from the first-bonding-surface peripheral regions by a vertical spacing that is the same as a thickness of the bonding pattern definition layer 790.

In another alternative embodiment, the second semiconductor die 700 is positioned below the first semiconductor die 900. In this alternative embodiment, the optional dielectric cover layer is formed on the second semiconductor die 700 and the dielectric pattern definition layer is formed on the first semiconductor die 900.

Referring to all drawings and according to various embodiments of the present disclosure, a bonded assembly is provided, which comprises: a first semiconductor die 900 comprising a first substrate 908, first semiconductor devices 920, and first bonding pads 988 that are electrically connected to a respective node of the first semiconductor devices 920; a second semiconductor die 700 comprising a second substrate 708, second semiconductor devices 720, and second bonding pads 788 that are electrically connected to a respective node of the second semiconductor devices 720; and a dielectric bonding pattern definition layer 790 located between the first semiconductor die 900 and the second semiconductor die 700 and including bonding pattern definition openings 792 therethrough, wherein each of the second bonding pads 788 comprises a respective second bonding-side surface having a second-bonding-surface center region that is bonded to a respective one of the first bonding pads 988 through a respective one of the bonding pattern definition openings 792 in the bonding pattern definition layer 790, and having a second-bonding-surface peripheral region that laterally surrounds the second-bonding-surface center region and contacts a surface of the dielectric bonding pattern definition layer 790.

In one embodiment, the first bonding pads 988 are embedded in a first pad-level dielectric layer 970; the second bonding pads 788 are embedded in a second pad-level dielectric layer 770; and the second pad-level dielectric layer 770 is vertically spaced from the first pad-level dielectric layer 970 at least by the dielectric bonding pattern definition layer 790. In one embodiment, each bonded pair of the first bonding pad 988 and the second bonding pad 788 is bonded to each other by metal-to-metal bonding induced by metal diffusion across a respective bonding interface 888. In one embodiment, each of the bonding pattern definition openings 792 have a smaller lateral area (i.e., smaller area in a horizontal plane) than each of the cover layer openings 992.

In one embodiment, one of the first semiconductor die 900 and the second semiconductor die 700 comprises a memory die including a three-dimensional array of memory elements, and another of the first semiconductor die 900 and the second semiconductor die 700 comprises a logic die including a logic circuitry configured to operate the three-dimensional array of memory elements.

The methods and structures of the various embodiments of the present disclosure can be employed to enhance the strength of metal-to-metal bonding between the first bonding pads 988 and the second bonding pads 788. The vertical expansion distances of the first bonding pads 988 may be limited to the area of the first-bonding-surface center region, and/or the vertical expansion distances of the second bonding pads 788 may be limited to the area of the second-bonding-surface center region. Because the volume expansion of each first bonding pad 988 and each second bonding pad 788 is limited within the areas of the first-bonding-surface center regions or within the areas of the second-bonding-surface center regions, the vertical expansion distances of the first bonding pads 988 and the vertical expansion distances of the second bonding pads 788 can increase compared to a geometry in which the dielectric cover layer 990 and/or the bonding pattern definition layer 790 are absent. Thus, the topographical variations of the surfaces of the bonding pads (988, 788) and the pad-level dielectric layers (970, 770) has lesser impact on the quality of the metal-to-metal bond, and the quality of metal-to-metal bonding can be enhanced through use of the dielectric cover layer 990 and/or the bonding pattern definition layer 790 of the embodiments of the present disclosure. In addition, the total area of the bonding interfaces between the first bonding pads 988 and the second bonding pads 788 can be increased, and greater bonding strength may be provided between the first semiconductor die 900 and the second semiconductor die 700. For example, the total area of the bonding interfaces may be in a range from 30% to 65% (e.g., the bonding area to dielectric ratio may be 1:3 or greater, such as 1:3 to 3:1). Further, the dielectric cover layer 990 and/or the bonding pattern definition layer 790 may reduce pad-to-pad electrical shorts that may be caused by misalignment of the metal pads during bonding.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a first semiconductor die comprising a first substrate, first semiconductor devices, and first bonding pads that are electrically connected to a respective node of the first semiconductor devices;
a second semiconductor die comprising a second substrate, second semiconductor devices, and second bonding pads that are electrically connected to a respective node of the second semiconductor devices; and
a dielectric bonding pattern definition layer located between the first semiconductor die and the second semiconductor die and including bonding pattern definition openings therethrough,
wherein each of the second bonding pads comprises a respective second bonding-side surface having a second-bonding-surface center region that is bonded to a respective one of the first bonding pads through a respective one of the bonding pattern definition openings in the bonding pattern definition layer, and having a second-bonding-surface peripheral region that laterally surrounds the second-bonding-surface center region and contacts a surface of the dielectric bonding pattern definition layer.

2. The bonded assembly of claim 1, wherein each contact area between a bonded pair of the first bonding pads and the second bonding pads coincides with an area of a respective one of the bonding pattern definition openings.

3. The bonded assembly of claim 2, wherein:
the first bonding pads are embedded in a first pad-level dielectric layer;
the second bonding pads are embedded in a second pad-level dielectric layer; and
the second pad-level dielectric layer is vertically spaced from the first pad-level dielectric layer at least by the dielectric bonding pattern definition layer.

4. The bonded assembly of claim 1, wherein the dielectric bonding pattern definition layer comprises a dielectric material selected from silicon oxide, silicon carbonitride, silicon nitride, silicon oxynitride, or a dielectric metal oxide, and has a thickness in a range from 10 nm to 50 nm.

5. The bonded assembly of claim 1, wherein each interface between the second-bonding-surface center regions of the second bonding pads and the first bonding pads is vertically offset from a horizontal plane including surfaces of the second-bonding-surface peripheral regions of the second bonding pads by a vertical offset distance that is at least one half of a thickness of the dielectric bonding pattern definition layer.

6. The bonded assembly of claim 5, wherein each of the first bonding pads comprises a respective first bonding-side surface having a first-bonding-surface center region that is bonded to a respective one of the second bonding pads, and having a first-bonding-surface peripheral region that laterally surrounds the first-bonding-surface center region.

7. The bonded assembly of claim 6, further comprising a dielectric cover layer located between, and contacting, the dielectric bonding pattern definition layer and the first semiconductor die, and including cover layer openings therethrough, wherein each of the bonding pattern definition openings have a smaller lateral area than each of the cover layer openings.

8. The bonded assembly of claim 7, wherein:
each of the bonding pattern definition openings is located entirely within an area of a respective one of the cover layer openings and has a respective periphery that is laterally offset inward from a periphery of the respective one of the cover layer openings;
the dielectric cover layer comprises a first dielectric material selected from silicon oxide, silicon carbonitride, silicon nitride, silicon oxynitride, or a dielectric metal oxide, and has a thickness in a range from 5 nm to 50 nm; and
the bonding pattern definition layer comprises a second dielectric material selected from silicon oxide, silicon carbonitride, silicon nitride, silicon oxynitride, or a dielectric metal oxide, and has a thickness in a range from 5 nm to 50 nm.

9. The bonded assembly of claim 7, wherein each of the first-bonding-surface peripheral regions contacts the bonding pattern definition layer at an inner periphery thereof, and contacts a respective portion of the dielectric bonding pattern definition layer at an outer periphery thereof.

10. The bonded assembly of claim 5, wherein:
each of the first-bonding-surface peripheral region contacts the dielectric bonding pattern definition layer; and
the first-bonding-surface peripheral regions are vertically spaced from the second-bonding-surface peripheral regions by a vertical spacing that is the same as a thickness of the dielectric bonding pattern definition layer.

11. The bonded assembly of claim 1, wherein each bonded pair of the first bonding pad and the second bonding pads is bonded to each other by metal-to-metal bonding induced by metal diffusion across a respective bonding interface.

12. The bonded assembly of claim 1, wherein:
one of the first semiconductor die and the second semiconductor die comprises a memory die including a three-dimensional array of memory elements; and
another of the first semiconductor die and the second semiconductor die comprises a logic die including a logic circuitry configured to operate the three-dimensional array of memory elements.

13. A method of forming a bonded assembly, comprising:
providing a first semiconductor die comprising a first substrate, first semiconductor devices, and first bonding pads that are electrically connected to a respective node of the first semiconductor devices;
providing a second semiconductor die comprising a second substrate, second semiconductor devices, and second bonding pads that are electrically connected to a respective node of the second semiconductor devices;
forming a dielectric bonding pattern definition layer including bonding pattern definition openings therethrough over the second bonding pads; and
bonding the second bonding pads to the first bonding pads, wherein the first metal pads expand through the bonding pattern definition openings and are bonded to a respective one of the second bonding pads;
wherein:
each of the second bonding pads comprises a respective second bonding-side surface have a second-bonding-surface center region that is physically exposed within a respective one of the bonding pattern definition openings, and have a second-bonding-surface peripheral region that laterally surrounds the second-bonding-surface center region and is covered by the dielectric bonding pattern definition layer;
the second bonding pads are embedded in a second pad-level dielectric layer; and
the dielectric bonding pattern definition layer is formed by depositing and patterning a dielectric material layer over the second bonding pads and the second pad-level dielectric layer.

14. The method of claim 13, wherein the dielectric bonding pattern definition layer comprises a dielectric material selected from silicon oxide, silicon carbonitride, silicon nitride, silicon oxynitride, or a dielectric metal oxide, and has a thickness in a range from 10 nm to 50 nm.

15. The method of claim 13, wherein each bonded pair of the first bonding pad and the second bonding pad has a respective bonding interface having a periphery that coincides with a respective one of the bonding pattern definition openings.

16. The method of claim 13, further comprising forming a dielectric cover layer including cover layer openings therethrough on the first bonding pads, wherein the dielectric cover layer is disposed between the dielectric bonding pattern definition layer and the first semiconductor die during and after bonding the second bonding pads to the first bonding pads, and wherein each of the bonding pattern definition openings is located entirely within an area of a respective one of the cover layer openings.

17. The method of claim 16, wherein the bonding pattern definition layer contacts each of the first bonding pads after the first bonding pads are bonded to the second bonding pads.

18. The method of claim 13, wherein:
each of the first bonding pads comprises a first bonding-side surface that faces the second semiconductor die; and
an entirety of each of the first bonding-side surfaces contacts the bonding pattern definition layer or a respective one of the second bonding pads.

19. The method of claim 13, wherein:
each bonded pair of the first bonding pad and the second bonding pad is bonded to each other by metal-to-metal bonding induced by metal diffusion across a respective bonding interface;
one of the first semiconductor die and the second semiconductor die comprises a memory die including a three-dimensional array of memory elements; and
another of the first semiconductor die and the second semiconductor die comprises a logic die including a logic circuitry configured to operate the three-dimensional array of memory elements.

\* \* \* \* \*